(12) United States Patent
Kim

(10) Patent No.: US 11,283,017 B2
(45) Date of Patent: Mar. 22, 2022

(54) ELECTRONIC DEVICE AND OPERATING METHOD OF ELECTRONIC DEVICE

(71) Applicant: SK hynix Inc., Icheon (KR)

(72) Inventor: Myoung Sub Kim, Seongnam (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/883,770

(22) Filed: May 26, 2020

(65) Prior Publication Data

US 2021/0104668 A1 Apr. 8, 2021

(30) Foreign Application Priority Data

Oct. 4, 2019 (KR) .................. 10-2019-0123112

(51) Int. Cl.
*H01L 45/00* (2006.01)
*G11C 13/00* (2006.01)
*H01L 27/24* (2006.01)

(52) U.S. Cl.
CPC ........ *H01L 45/144* (2013.01); *G11C 13/0004* (2013.01); *H01L 27/24* (2013.01); *H01L 45/06* (2013.01); *H01L 45/1253* (2013.01)

(58) Field of Classification Search
CPC .................................................. G11C 13/004
See application file for complete search history.

(56) References Cited

U.S. PATENT DOCUMENTS 7,719,886 B2 5/2010 Philipp et al.
9,543,510 B2 1/2017 Miao et al.
2019/0345607 A1* 11/2019 Carta .................. H01L 45/1253

* cited by examiner

*Primary Examiner* — Mounir S Amer

(57) ABSTRACT

An electronic device may include a semiconductor memory. The semiconductor memory may include: a first variable resistance layer including antimony (Sb); a second variable resistance layer including antimony (Sb) with a content different from that of the first variable resistance layer, the second variable resistance layer having a crystallization speed different from that of the first variable resistance layer; and a first electrode interposed between the first variable resistance layer and the second variable resistance layer.

19 Claims, 9 Drawing Sheets

ELECTRONIC DEVICE AND OPERATING METHOD OF ELECTRONIC DEVICE

CROSS-REFERENCE TO RELATED APPLICATION

The present application claims priority under 35 U.S.C. § 119(a) to Korean patent application number 10-2019-0123112 filed on Oct. 4, 2019, the entire disclosure of which is incorporated herein by reference in its entirety.

BACKGROUND

1. Technical Field

The present disclosure generally relates to an electronic device, and more particularly, to an electronic device including a semiconductor memory and an operating method of an electronic device.

2. Related Art

Recently, as electronic devices or appliances trend toward miniaturization, low power consumption, high performance, multi-functionality, and the like, there has been a demand for semiconductor devices capable of storing information in various electronic devices or appliances such as a computer and a portable communication device. Thus, research has been conducted for semiconductor devices capable of storing data using a characteristic that the semiconductor devices are switched between different resistance states according to a voltage or current applied thereto. Examples of the semiconductor devices are a resistive random access memory (RRAM), a phase change random access memory (PRAM), a ferroelectric random access memory (FRAM), a magnetic random access memory (MRAM), an E-fuse, and the like.

SUMMARY

Embodiments provide an electronic device capable of improving the operational characteristics and reliability thereof, and an operating method of an electronic device.

In accordance with an aspect of the present disclosure, there is provided an electronic device including a semiconductor memory, wherein the semiconductor device includes: a first variable resistance layer including antimony (Sb); a second variable resistance layer including antimony (Sb) with a content different from that of the first variable resistance layer, the second variable resistance layer having a crystallization speed different from that of the first variable resistance layer; and a first electrode interposed between the first variable resistance layer and the second variable resistance layer.

In accordance with another aspect of the present disclosure, there is provided an electronic device including a semiconductor memory, wherein the semiconductor memory includes: a first variable resistance layer including antimony (Sb); a second variable resistance layer including antimony (Sb) with a content higher than that of the first variable resistance layer, the second variable resistance layer having a crystallization speed higher than that of the first variable resistance layer; a third variable resistance layer including antimony (Sb) with a content higher than that of the second variable resistance layer, the third variable resistance layer having a crystallization speed higher than that of the second variable resistance layer; a first electrode interposed between the first variable resistance layer and the second variable resistance layer; and a second electrode interposed between the second variable resistance layer and the third variable resistance layer.

In accordance with still another aspect of the present disclosure, there is provided an electronic device including a semiconductor memory, wherein the semiconductor memory includes: a first variable resistance layer; a second variable resistance layer having a crystallization speed different from that of the first variable resistance layer; and a first electrode interposed between the first variable resistance layer and the second variable resistance layer, wherein the first variable resistance layer, or the second variable resistance layer, or both include a first doping element which decreases a crystallization speed of a variable resistance material or a second doping element which increases the crystallization speed.

In accordance with still another aspect of the present disclosure, there is provided a method for operating an electronic device including a semiconductor memory, wherein the semiconductor memory includes: a first variable resistance layer including antimony (Sb); a second variable resistance layer including antimony (Sb) with a content higher than that of the first variable resistance layer; and a first electrode interposed between the first variable resistance layer and the second variable resistance layer, wherein the method includes selectively crystallizing the second variable resistance layer by applying a first partial set pulse.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
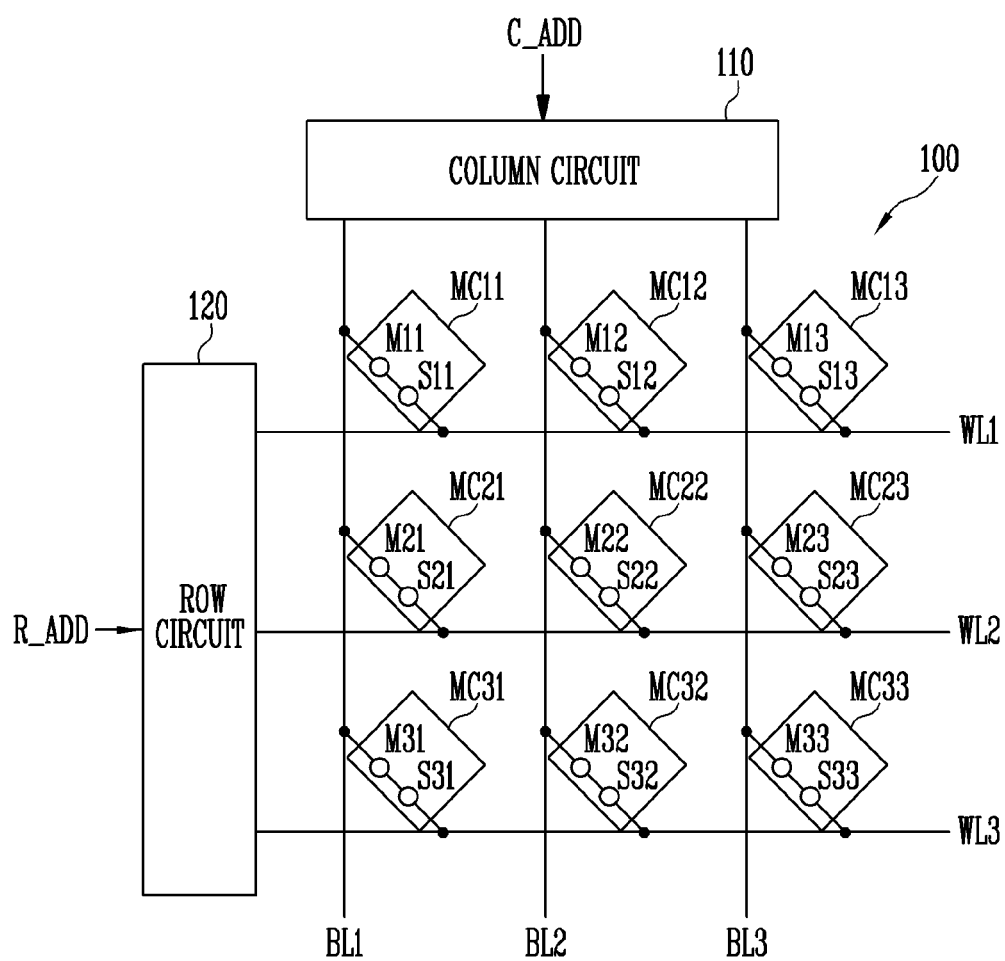
FIG. 1 is a view illustrating a structure of an electronic device in accordance with an embodiment of the present disclosure.

Hereinafter, various embodiments will be described in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). In a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate. Throughout the disclosure, like reference numerals refer to like parts throughout the various figures and embodiments of the present disclosure.

FIG. 1 is a view illustrating a structure of an electronic device in accordance with an embodiment of the present disclosure.

Referring to FIG. 1, the electronic device in accordance with the embodiment of the present disclosure may include a semiconductor memory. The semiconductor memory may be a nonvolatile memory device, and be a variable resistance memory device. The semiconductor memory may include row lines and column lines intersecting the row lines. The row lines may be word lines, and the column lines may be bit lines. The word lines and the bit lines are relative concepts. For example, the row lines may be bit lines and the column lines may be word lines. Hereinafter, a case where the row lines are word lines and the column lines are bit lines is assumed and described.

The cell array 100 may include memory cells MC11 to MC33 respectively disposed between column lines BL1 to BL3 and row lines WL1 to WL3. The memory cells MC11 to MC33 may be disposed at respective intersection points of the column lines BL1 to BL3 and the row lines WL1 to WL3. Each of the memory cells MC11 to MC33 may include a corresponding one of selection elements S11 to S33, or a corresponding one of memory elements M11 to M33, or both. For example, each of the memory cells MC11 to MC33 may include a corresponding selection element among the selection elements S11 to S33 and a corresponding memory element among the memory elements M11 to M33, which are connected in series. The selection elements S11 to S33 may be electrically connected to the row lines WL1 to WL3, and the memory elements M11 to M33 may be electrically connected to the column lines BL1 to BL3.

Each of the memory elements M11 to M33 is a storage node for storing data, and may include a variable resistance material. The variable resistance material may be a resistive material, a Magnetic Tunnel Junction (MTJ), a phase change material, or the like. Each of the selection elements S11 to S33 is used to select a corresponding one of the memory cells MC11 to MC33, and may include a switching material. Each of the selection elements S11 to S33 may be a diode, a PNP diode, a Bipolar Junction Transistor (BJT), a Metal Insulator Transition (MIT) element, a Mixed Ionic-Electronic Conduction (MIEC) element, an Ovonic Threshold Switching (OST) element, or the like.

The shape and configuration of each of the memory cells MC11 to MC33 may be variously modified. For example, the selection elements S11 to S33 may be omitted, or the memory elements M11 to M33 may be omitted. Alternatively, the positions of the selection elements S11 to S33 and the memory elements M11 to M33 may be reversed. For example, the selection elements S11 to S33 may be electrically connected to the column lines BL1 to BL3, and the memory elements M11 to M33 may be electrically connected to the row lines WL1 to WL3.

In addition, the semiconductor memory may further include a column circuit 110 for controlling the column lines BL1 to BL3 and a row circuit 120 for controlling the row lines WL1 to WL3.

The row circuit 120 may be a row decoder, a word line decoder, a word line driver, or the like. The row circuit 120 may select a row line WL2 among the row lines WL1 to WL3 according to a row address R_ADD. The column circuit 110 may be a column decoder, a bit line decoder, a bit line driver, or the like. The column circuit 110 may select a column line BL2 among the column lines BL1 to BL3 according to a column address C_ADD. Therefore, a memory cell MC22 connected between the selected column line BL2 and the selected row line WL2 may be selected.

Although three column lines BL1 to BL3 and three row lines WL1 to WL3 are illustrated in FIG. 1, this is merely for convenience of description, and embodiments of the present disclosure are not limited thereto. The numbers of the column lines BL1 to BL3 and the row lines WL1 to WL3, which are included in the cell array 100, may be changed, if necessary.

Figure 2A:
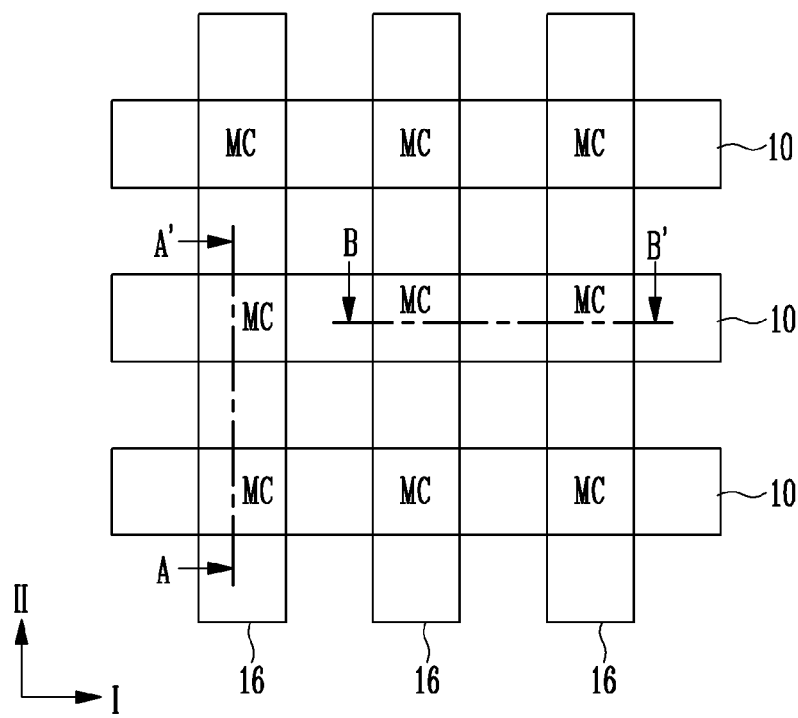
FIGS. 2A, 2B, and 2C are views each illustrating a structure of an electronic device in accordance with an embodiment of the present disclosure.
Figure 2B:
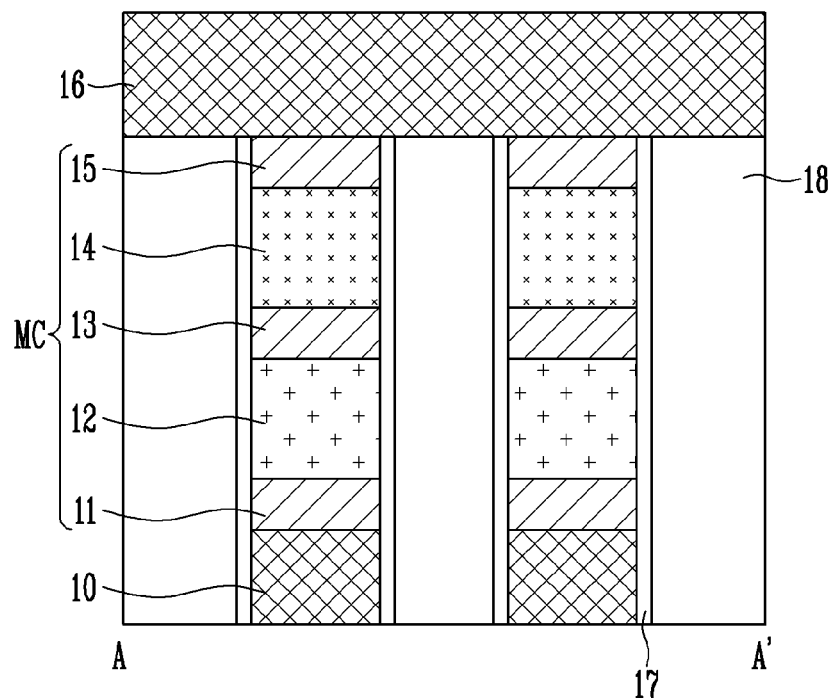
Figure 2C:
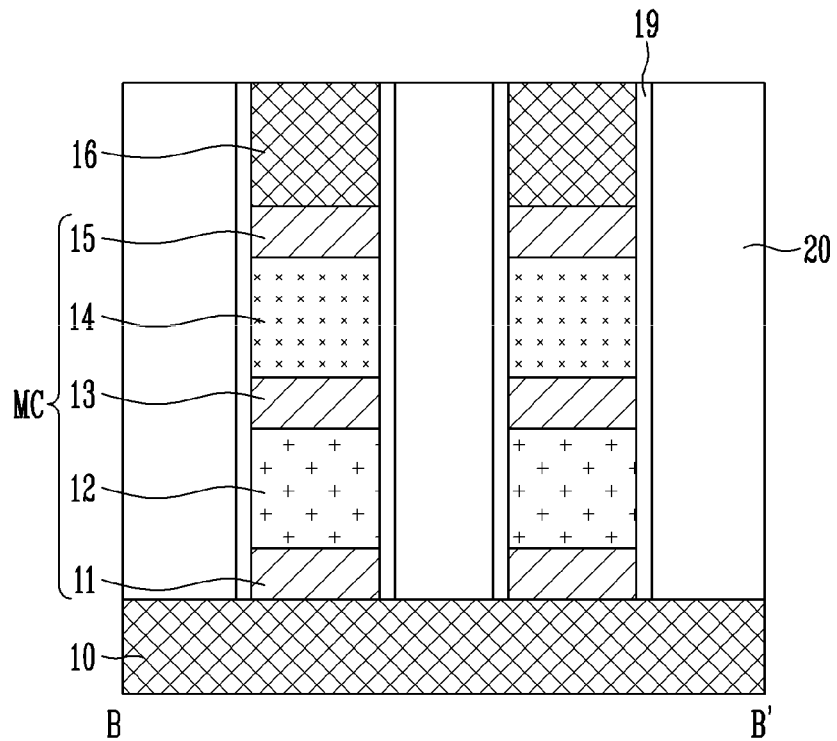

FIGS. 2A, 2B, and 2C are views each illustrating a structure of an electronic device in accordance with an embodiment of the present disclosure. FIG. 2A is a layout of the electronic device, FIG. 2B is a sectional view along a line A-A' shown in FIG. 2A, and FIG. 2C is a sectional view along a line B-B' shown in FIG. 2A.

Referring to FIGS. 2A to 2C, the electronic device in accordance with the embodiment of the present disclosure may include a semiconductor memory, and the semiconductor memory may include a plurality of memory cells MC. The semiconductor memory device may be a nonvolatile memory device, and be a variable resistance memory device.

Each of the memory cells MC may include a first electrode 11, a switching layer 12, a second electrode 13, a variable resistance layer 14, and a third electrode 15. In addition, protective layers 17 and 19 may be formed on sidewalls of the memory cell MC, and insulating layers 18 and 20 may be filled between the memory cells MC.

The variable resistance layer 14 may include a phase change material. The phase change material has a low resistance property in a crystalline state and has a high resistance property in a non-crystalline state. Therefore, data may be stored by performing a set operation of switching the state of the phase change material from a high resistance amorphous state to a low resistance crystalline state, and by performing a reset operation of switching the state of the phase change material from a low resistance crystalline state to a high resistance amorphous state. When the variable resistance layer 14 has a low resistance state, data '1' may be stored. When the variable resistance layer 14 has a high resistance state, data '0' may be stored.

The variable resistance layer 14 may include a chalcogenide-based material such as germanium (Ge), antimony (Sb), tellurium (Te), bismuth (Bi), or tin (Sn), or include any combination thereof. The variable resistance layer 14 may include Ge—Sb—Te (GST), and include $Ge_2Sb_2Te_5$, $Ge_2Sb_2Te_7$, $Ge_1Sb_2Te_4$, $Ge_1Sb_4Te_7$, or the like. The chemical composition ratio of the variable resistance layer 14 may be determined by considering properties such as a melting point and a crystallization temperature. Also, the variable resistance layer 14 may further include a doping element such as boron (B), carbon (C), nitrogen (N), oxygen (O), silicon (Si), zinc (Zn), gallium (Ga), arsenic (As), selenium (Se), silver (Ag), indium (In), or include any combination thereof.

The variable resistance layer 14 may have a multi-layered structure, and the memory cell MC may have a structure in which variable resistance layers and electrodes are alternately stacked. This will be described below in detail with reference to FIG. 3.

The switching layer 12 may be a selection element which controls the flow of current according to the magnitude of a voltage or current applied thereto. When the magnitude of the applied voltage and current is a threshold value or less, current hardly flows in the switching layer 12. When the magnitude of the applied voltage and current exceeds the threshold value, a rapidly increased current flows in the switching layer 12.

When the switching layer 12 is a Metal Insulator Transition (MIT) element, the switching layer 12 may include $VO_2$, $NbO_2$, $TiO_2$, $WO_2$, $TiO_2$, etc. When the switching layer 12 is a Mixed Ion-Electron Conducting (MIEC) element, the switching layer 12 may include $ZrO_2(Y_2O_3)$, $Bi_2O_3$—BaO, $(La_2O_3)_x(CeO_2)_{1-x}$, etc. Also, when the switching layer 12 is an Ovonic Threshold Switching (OST) element, the switching layer 12 may include a chalcogenide-based material such as AsTe, AsSe, AsTeSe, AsTeGe, AsSeGe, or AsTeGeSe.

The first electrode 11 may be electrically connected to a row line 10, the second electrode 13 may be interposed between the switching layer 12 and the variable resistance layer 14, and the third electrode 15 may be electrically connected to a column line 16. The first electrode 11, the second electrode 13, and the third electrode 15 may include a conductive material such as metal or metal nitride. For example, each of the first electrode 11, the second electrode 13, and the third electrode 15 may include tungsten (W), tungsten nitride (WN), tungsten silicide (WSi), titanium (Ti), titanium nitride ($WN_x$), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pd), platinum (Pt), etc., or include any combination thereof.

In accordance with the structure described above, the first electrode 11, the switching layer 12, and the second electrode 13 can constitute a selection element. The second electrode 13, the variable resistance layer 14, and the third electrode 15 can constitute a memory element. In addition, the selection element and the memory element can share the second electrode 13.

Figure 3:
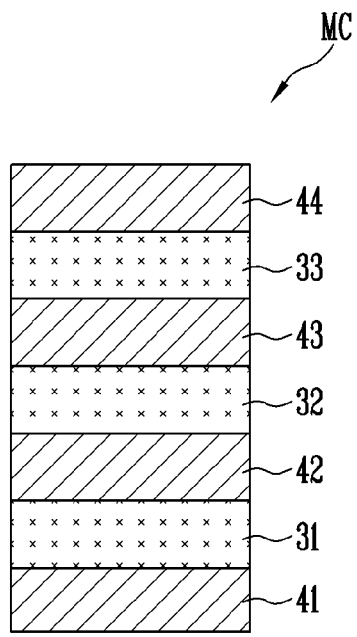
FIG. 3 is a view illustrating a section of an electronic device in accordance with an embodiment of the present disclosure.

FIG. 3 is a view illustrating a section of a portion of an electronic device in accordance with an embodiment of the present disclosure. The electronic device may include a semiconductor memory, and FIG. 3 may be a sectional view of a memory cell MC included in the semiconductor memory.

Referring to FIG. 3, the memory cell MC in accordance with the embodiment of the present disclosure may include a plurality of variable resistance layers 31 to 33 and a plurality of electrodes 41 to 44. The plurality of variable resistance layers 31 to 33 and the plurality of electrodes 41 to 44 may be alternately stacked. The memory cell MC may include a first variable resistance layer 31, a second variable resistance layer 32, and a third variable resistance layer 33, and include a first electrode 41, a second electrode 42, a third electrode 43, and a fourth electrode 44, which are alternately stacked with the first variable resistance layer 31, a second variable resistance layer 32, and a third variable resistance layer 33. Although not shown in FIG. 3, the memory cell MC may further include a switching layer.

The memory cell MC may include a plurality of variable resistance layers 31 to 33 including antimony (Sb) with different contents. A variable resistance layer having a high content of antimony (Sb) may have a crystallization speed higher than that of a variable resistance layer having a low content of antimony (Sb). In other words, a variable resistance layer having a high content of antimony (Sb) may have a set operation speed higher than that of a variable resistance layer having a low content of antimony (Sb). Therefore, the content of antimony (Sb) is adjusted, so that a plurality of variable resistance layers 31 to 33 included in the same memory cell MC can be controlled to have different crystallization speeds or different set operation speeds.

First to third variable resistance layers 31 to 33 may include antimony (Sb) with different contents. The second variable resistance layer 32 may include antimony (Sb) with a content higher than that of the first variable resistance layer 31, and have a crystallization speed or a set operation speed higher than that of the first variable resistance layer 31. The third variable resistance layer 33 may include antimony (Sb) with a content higher than that of the second variable resistance layer 32, and have a crystallization speed or a set operation speed higher than that of the second variable resistance layer 32.

In an embodiment, the first variable resistance layer 31 may include germanium (Ge) of 10 to 20 at %, antimony (Sb) of 20 to 25 at %, and tellurium (Te) of 45 to 55 at %. The second variable resistance layer 32 may include germanium (Ge) of 10 to 20 at %, antimony (Sb) of 25 to 30 at %, and tellurium (Te) of 45 to 55 at %. The third variable resistance layer 33 may include germanium (Ge) of 10 to 20 at %, antimony (Sb) of 30 to 35 at %, and tellurium (Te) of 45 to 55 at %.

One or more of the first to third variable resistance layers 31 to 33 may include a doping element. One or more of the first to third variable resistance layers 31 to 33 may include a doping element of 0 to 25 at % or include a doping element of 0 to 10 at %. The doping element may include one or more of B, C, N, O, Si, Zn, Ga, As, Se, Ag, In, and Sn.

In an embodiment, a doping element may accelerate crystallization of a variable resistance layer, and include one or more of B, Zn, Ag, In, and Sn. A variable resistance layer including the doping element which accelerates crystallization may have a crystallization speed higher than that of a variable resistance layer which does not include the doping element. In addition, a variable resistance layer having a high content of the doping element may have a crystallization speed higher than that of a variable resistance layer having a low content of the doping element.

In an embodiment, a doping element may hinder crystallization of a variable resistance layer, and include one or more of C, N, O, Si, Ga, As, and Se. A variable resistance layer including the doping element which hinders crystallization may have a crystallization speed lower than that of a variable resistance layer which does not include the doping element. In addition, a variable resistance layer having a high content of the corresponding doping element may have a crystallization speed lower than that of a variable resistance layer having a low content of the doping element.

Crystallization speeds of the first to third variable resistance layers 31 to 33 may be adjusted according to a chemical composition ratio of Ge—Sb—Te (GST), be adjusted according to a content of a doping element, or be adjusted by combining the chemical composition ratio and the content. The first to third variable resistance layers 31 to 33 may be formed to include GST having different chemical composition ratios, so that the crystallization speed of each of the first to third variable resistance layers 31 to 33 can be adjusted. A doping element may be added to the first to third variable resistance layers 31 to 33 having different chemical composition ratios, so that the crystallization speed of each of the first to third variable resistance layers 31 to 33 can be more minutely adjusted. Alternatively, the first to third variable resistance layers 31 to 33 may be formed to include GST having substantially the same chemical composition ratio, and the crystallization speed of each of the variable resistance layers 31 to 33 may be controlled using a doping element.

Meanwhile, although a case where the first to third variable resistance layers 31 to 33 are sequentially stacked is illustrated in FIG. 3, embodiments of the present disclosure are not limited thereto. The stacking sequence of the first to third variable resistance layers 31 to 33 may be changed. The variable resistance layers may be sequentially stacked from a variable resistance layer having the lowest crystallization speed, be sequentially stacked from a variable resistance layer having the highest crystallization speed, or be randomly stacked regardless of the crystallization speeds.

In accordance with the structure described above, one memory cell MC may include a plurality of variable resistance layers 31 to 33. Multi-bit data can be stored in the one memory cell MC by using a difference in crystallization speeds or set operation speeds between the variable resistance layers 31 to 33.

FIGS. 4A, 4B, 4C, and 4D are views each illustrating an operating method of an electronic device in accordance with an embodiment of the present disclosure. Hereinafter, a method for storing multi-bit data in one memory cell MC including a plurality of variable resistance layers will be described.

Referring to FIGS. 4A to 4D, the electronic device may perform a reset operation, a partial set operation, or a fully set operation according to write data. Table 1 represents states of first, second, and third variable resistance layers PCM1, PCM2, and PCM3 according to values of write data.

TABLE 1

|  | RESET (00) | Partial SET (01) | Partial SET (10) | Fully SET (11) |
|---|---|---|---|---|
| PCM1 | RESET | RESET | RESET | SET |
| PCM2 | RESET | RESET | SET | SET |
| PCM3 | RESET | SET | SET | SET |

In an embodiment, the first to third variable resistance layers PCM1 to PCM3 may have different set operation speeds depending on chemical composition ratios. The first variable resistance layer PCM1 may include antimony (Sb) of 20 to 25 at %, the second variable resistance layer PCM2 may include antimony (Sb) of 25 to 30 at %, and the third variable resistance layer PCM3 may include antimony (Sb) of 30 to 35 at %. Therefore, the second variable resistance layer PCM2 may have a crystallization speed higher than that of the first variable resistance layer PCM1, and the third variable resistance layer PCM3 may have a crystallization speed higher than that of the second variable resistance layer PCM2. In addition, one or more of the first to third variable resistance layers PCM1 to PCM3 may further include a doping element which hinders crystallization of a variable resistance material or a doping element which accelerates crystallization.

In an embodiment, the first to third variable resistance layers PCM1 to PCM3 may have different set operation speeds depending on doping elements. In addition, the set operation speed may be minutely adjusted according to the kind, content, etc. of a doping element included in each of the first to third variable resistance layers PCM1 to PCM3. The first variable resistance layer PCM1 may include one or more doping elements among C, N, O, Si, Ga, As, and Se, and the third variable resistance layer PCM3 may include one or more doping elements among B, Zn, Ag, In, and Sn. Therefore, the second variable resistance layer PCM2 may have a crystallization speed higher than that of the first variable resistance layer PCM1, and the third variable resistance layer PCM3 may have a crystallization speed higher than that of the second variable resistance layer PCM2. The first to third variable resistance layers PCM1 to PCM3 may have the same chemical composition ratio or have different chemical composition ratios.

Figure 4A:
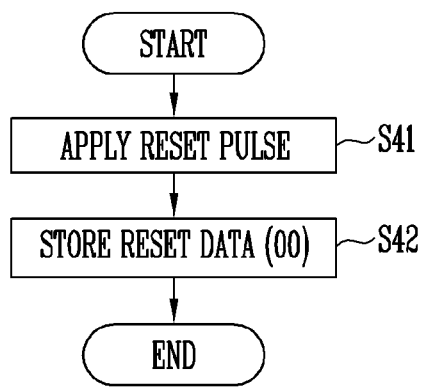
FIGS. 4A, 4B, 4C, and 4D are views each illustrating an operating method of an electronic device in accordance with an embodiment of the present disclosure.

Referring to FIG. 4A and Table 1, a reset pulse is applied to the memory cell (e.g., the memory cell MC in FIG. 3) at S41. For example, the reset pulse of 100 µA or more is applied to the memory cell MC for 10 to 50 ns. Through a reset operation, the first to third variable resistance layers PCM1 to PCM3 all have a high resistance amorphous state. The first to third variable resistance layers PCM1 to PCM3 each has a reset state. Accordingly, reset data (00) may be written in the memory cell at S42.

Figure 4B:
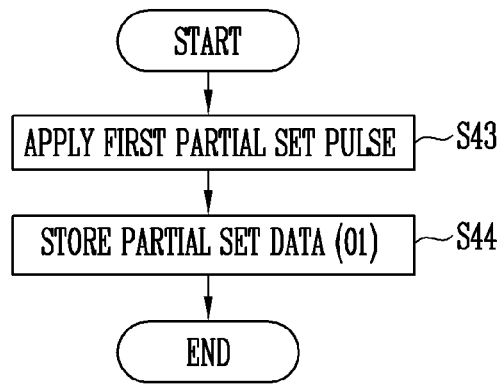

Referring to FIG. 4B and Table 1, a first partial set pulse is applied to the memory cell MC at S43. Through a first partial set operation, one of the first to third variable resistance layers PCM1 to PCM3 has a low resistance crystalline state. For example, the third variable resistance layer PCM3 having the highest set operation speed or set operation speed among the first to third variable resistance layers PCM1 to PCM3 may be selectively crystallized to have a low resistance state. The third variable resistance layer PCM3 has a set state, and the first and second variable resistance layers PCM1 and PCM2 maintain the reset state.

The first partial set pulse may have a peak level lower than that of the reset pulse, and be applied longer than the reset pulse. For example, the first partial set pulse of 50 µA or less is applied to the memory cell MC for 100 to 200 ns. Accordingly, partial set data (01) may be written in the memory cell at S44.

Figure 4C:
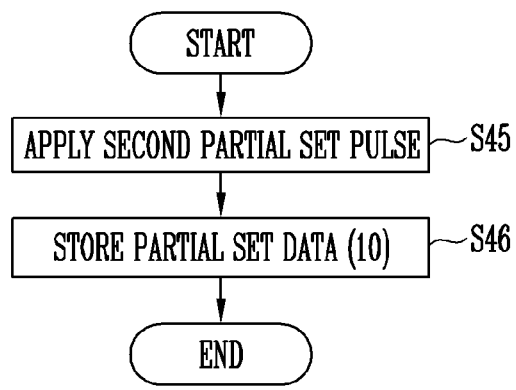

Referring to FIG. 4C and Table 1, a second partial set pulse is applied to the memory cell MC at S45. Through a second partial set operation, two of the first to third variable resistance layers PCM1 to PCM3 each has a low resistance crystalline state. For example, the second and third variable resistance layers PCM2 and PCM3 having a relatively high set operation speed or set operation speed among the first to third variable resistance layers PCM1 to PCM3 may be selectively crystallized to have a low resistance state. The second and third variable resistance layers PCM2 and PCM3 have the set state, and the first variable resistance layer PCM1 maintains the reset state.

The second partial set pulse may have a peak level equal or similar to that of the first partial set pulse, and be applied longer than the first partial set pulse. The second partial set pulse may have a peak level lower than that of the reset pulse, and be applied longer than the reset pulse. For example, the second partial set pulse of 50 µA or less is applied to the memory cell MC for 300 to 600 ns. Accordingly, partial set data (10) may be written in the memory cell MC at S46.

Figure 4D:
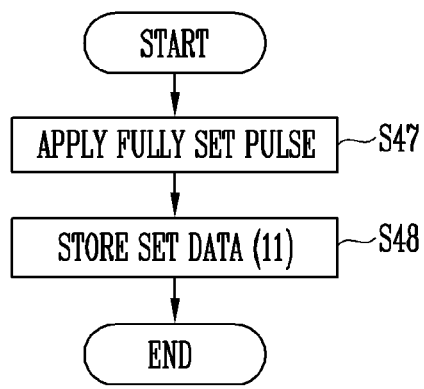

Referring to FIG. 4D and Table 1, a fully set pulse is applied to the memory cell MC at S47. Through a fully set operation, the first to third variable resistance layers PCM1 to PCM3 all have a low resistance crystallization state. The first to third variable resistance layers PCM1 to PCM3 have the set state.

The fully set pulse may have a peak level equal or similar to that of the second partial set pulse, and be applied longer than the second partial set pulse. For example, the fully set pulse of 50 µA or less is applied to the memory cell MC for 800 to 1000 ns. Accordingly, set data (11) may be written in the memory cell MC at S48.

Figure 5:
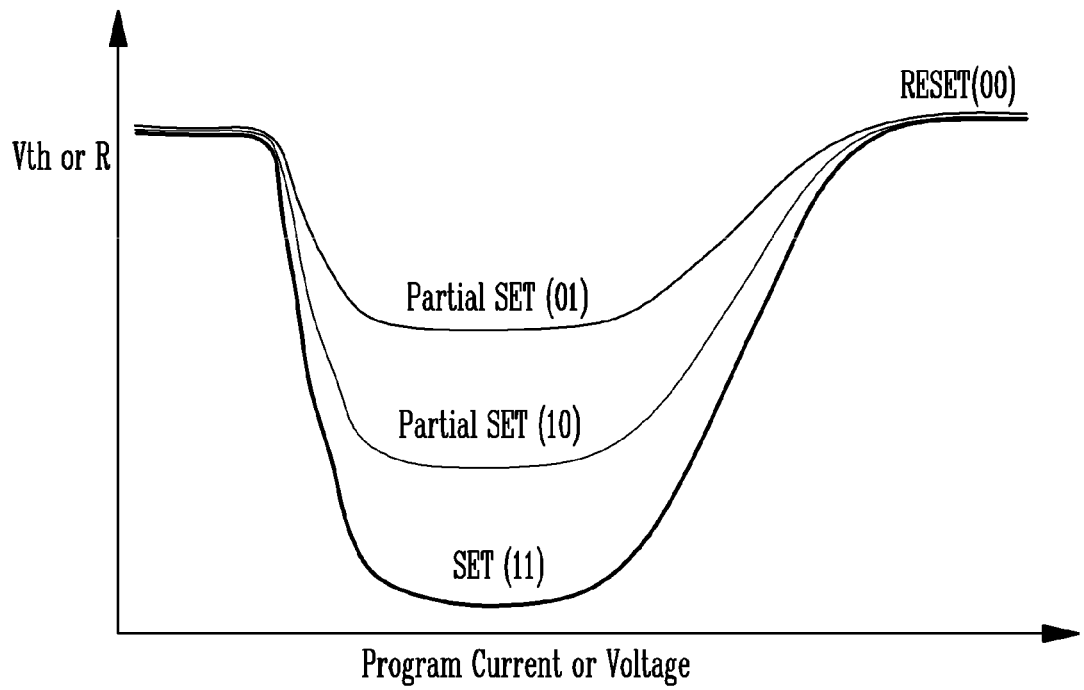
FIG. 5 is a view illustrating an operational characteristic of an electronic device in accordance with an embodiment of the present disclosure.

FIG. 5 is a view illustrating an operational characteristic of an electronic device in accordance with an embodiment of the present disclosure. The X axis represents a program current or voltage applied to a memory cell, and the Y axis represents resistance value R or threshold voltage Vth of the memory cell.

Referring to the graph shown in FIG. 5, when a reset operation, a first partial set operation, a second partial set operation, and a fully set operation are performed, the threshold voltage Vth or resistance value R of the memory cell is changed.

Reset data (00) may be written in the memory cell through the reset operation, partial set data (01) may be written in the memory cell through the first partial set operation, partial set data (10) may be written in the memory cell through the second partial set operation, and set data (11) may be written in the memory cell through the fully set operation.

The reset operation may use a program current or voltage having a level higher than that of the first partial set operation, the second partial set operation, and the fully set operation. The first partial set operation, the second partial set operation, and the fully set operation may use a program current or voltage having a level lower than that of the reset operation. The first partial set operation, the second partial set operation, and the fully set operation may have different waveforms. The first partial set operation, the second partial set operation, and the fully set operation may use a program current or voltage having levels substantially equal or similar to one another, and have different periods for which the program current or voltage is applied. A reset pulse may be applied for a period of 100 ns or less, and a first partial set pulse may be applied for a period of about 100 ns, a second partial set pulse may be applied for a period of about 300 ns, and a fully set pulse may be applied for a period of about 1000 ns.

The memory cell may have different threshold voltages Vth or different resistance values R depending on data written therein. The memory cell in which reset data (00) is written may have the highest threshold voltage Vth or resistance value R. The memory cell in which the set data (11) is written may have the lowest threshold voltage Vth or resistance value R. The memory cell in which the partial set data (10 or 01) is written may have a threshold value Vth or resistance value R between a set state and a reset state. The memory cell in which the partial set data (01) is written may have a threshold voltage Vth or resistance value R higher than that of the memory cell in which the partial set data (10) is written.

Figure 6:
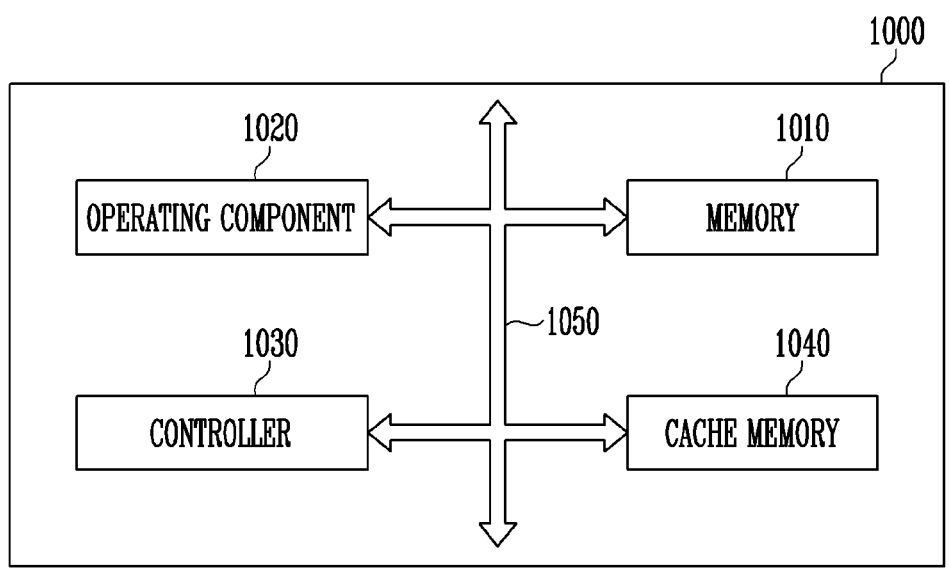
FIG. 6 is a configuration view of a microprocessor implementing a memory device in accordance with an embodiment of the present disclosure.

FIG. 6 is a configuration view of a microprocessor implementing a memory device in accordance with an embodiment of the present disclosure.

Referring to FIG. 6, the microprocessor 1000 may perform tasks for controlling and tuning a series of processes of receiving data from various external devices, processing the data, and outputting processing results to external devices. The microprocessor 1000 may include a memory 1010, an operating component 1020, a controller 1030, and the like. The microprocessor 1000 may be various data processing units such as a central processing unit (CPU), a graphic processing unit (GPU), a digital signal processor (DSP), and an application processor (AP).

The memory 1010 is a part which stores data in the microprocessor 1000, as a processor register, register or the like. The memory 1010 may include a data register, an address register, a floating point register, and the like. Besides, the memory 1010 may include various registers. The memory 1010 may perform the function of temporarily storing data for which operations are to be performed by the operating component 1020, result data of performing the operations and addresses where data for performing of the operations are stored.

The memory 1010 may include one or more of the above-described semiconductor devices in accordance with the embodiments. For example, the memory 1010 may include a semiconductor memory including: a first variable resistance layer including antimony (Sb); a second variable resistance layer including antimony (Sb) with a content different from that of the first variable resistance layer, the second variable resistance layer having a crystallization speed different from that of the first variable resistance layer; and a first electrode interposed between the first variable resistance layer and the second variable resistance layer. Accordingly, operational characteristics of the memory 1010 can be improved. Consequently, operational characteristics of the microprocessor 1000 can be improved.

The operating component 1020 may perform several arithmetical operations or logical operations according to results that the controller 1030 decodes commands. The operating component 1020 may include at least one arithmetic logic unit (ALU) and the like.

The controller 1030 may receive signals from the memory 1010, the operating component 1020 and an external device of the microprocessor 1000, perform extraction, decoding of commands, and controlling input and output of signals of the microprocessor 1000, and execute processing represented by programs.

The microprocessor 1000 in accordance with this embodiment may additionally include a cache memory 1040 which can temporarily store data to be inputted from an external device other than the memory 1010 or to be outputted to an external device. The cache memory 1040 may exchange data with the memory 1010, the operating component 1020 and the controller 1030 through a bus interface 1050.

Figure 7:
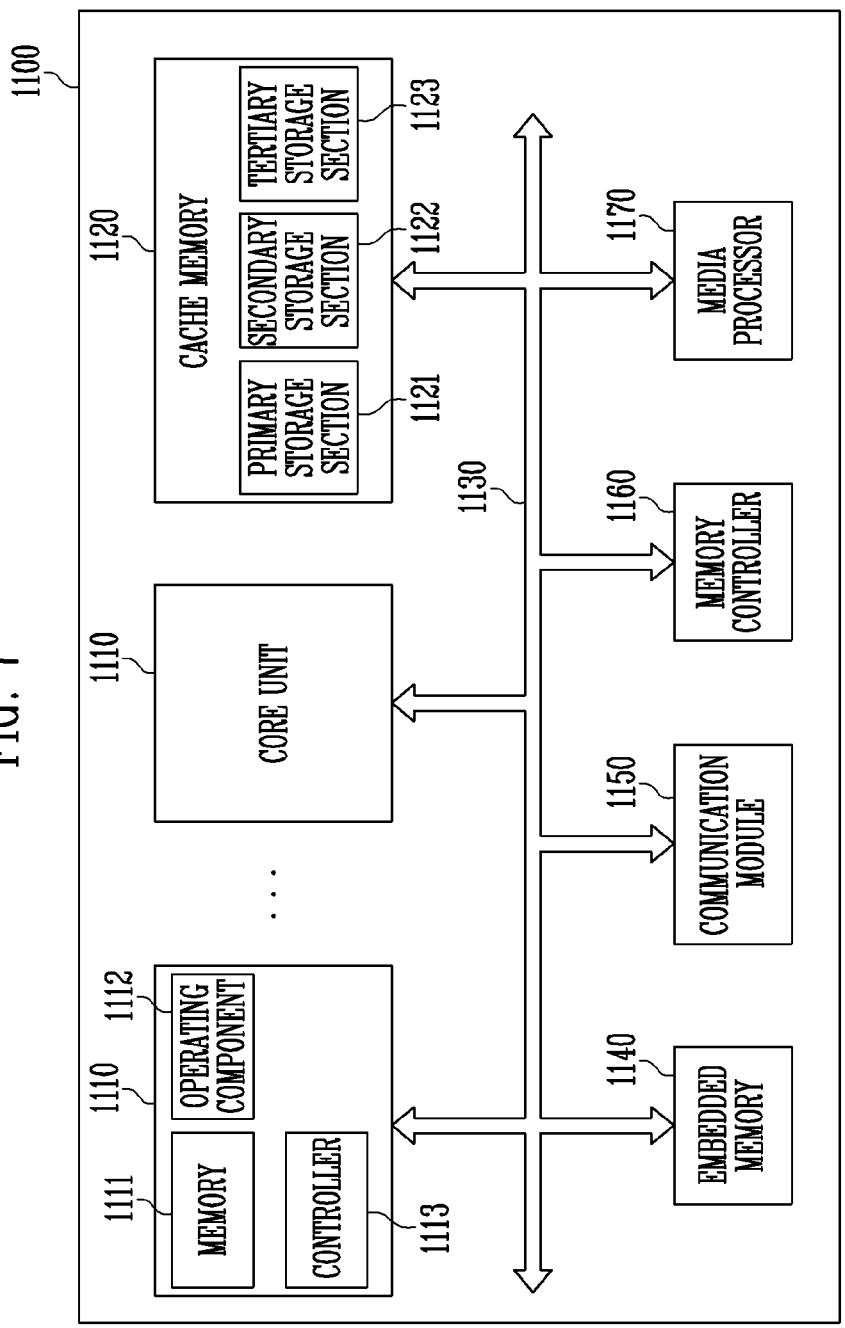
FIG. 7 is a configuration view of a processor implementing a memory device in accordance with an embodiment of the present disclosure.

FIG. 7 is a configuration view of a processor implementing a memory device in accordance with an embodiment of the present disclosure.

Referring to FIG. 7, the processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory 1120 which serves to storing data temporarily, and a bus interface 1130 for transferring data between internal and external devices. The processor 1100 may include various system-on-chips (SoCs) such as a multi-core processor, a graphic processing unit (GPU), and an application processor (AP).

The core unit 1110 of this embodiment is a part which performs arithmetic logic operations for data inputted from an external device, and may include a memory 1111, an operating component 1112 and a controller 1113.

The memory 1111 is a part which stores data in the processor 1100, as a processor register, a register or the like. The memory 1111 may include a data register, an address register, a floating point register, and the like. Besides, the memory 1111 may include various registers. The memory 1111 may perform the function of temporarily storing data for which operations are to be performed by the operating component 1112, result data of performing the operations and addresses where data for performing of the operations are stored. The operating component 1112 is a part which performs operations in the processor 1100. The operating component 1112 may perform several arithmetical operations, logical operations, according to results that the controller 1113 decodes commands, or the like. The operating component 1112 may include at least one arithmetic logic unit (ALU) and the like. The controller 1113 may receive signals from the memory 1111, the operating component 1112 and an external device of the processor 1100, perform extraction, decoding of commands, controlling input and output of signals of processor 1100, and execute processing represented by programs.

The cache memory 1120 is a part which temporarily stores data to compensate for a difference in data processing speed between the core unit 1110 operating at a high speed and an external device operating at a low speed. The cache memory 1120 may include a primary storage section 1121, a secondary storage section 1122 and a tertiary storage section 1123. In general, the cache memory 1120 includes the primary and secondary storage sections 1121 and 1122, and may include the tertiary storage section 1123 in the case where high storage capacity is required. As the occasion demands, the cache memory 1120 may include an increased number of storage sections. That is, the number of storage sections which are included in the cache memory 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory 1120 may include one or more of the above-described semiconductor devices in accordance with the embodiments. For example, the cache memory 1120 may include a semiconductor memory including: a first variable resistance layer including antimony (Sb); a second variable resistance layer including antimony (Sb) with a content different from that of the first variable resistance layer, the second variable resistance layer having a crystallization speed different from that of the first variable resistance layer; and a first electrode interposed between the first variable resistance layer and the second variable resistance layer.

Although a case where all the primary, secondary and tertiary storage sections 1121, 1122 and 1123 are configured inside the cache memory 1120 is illustrated in FIG. 7, all the primary, secondary and tertiary storage sections 1121, 1122 and 1123 of the cache memory 1120 may be configured outside the core unit 1110 and may compensate for a difference in data processing speed between the core unit 1110 and the external device. Alternatively, the primary storage section 1121 of the cache memory 1120 may be disposed inside the core unit 1110 and the secondary storage section 1122 and the tertiary storage section 1123 may be configured outside the core unit 1110 to strengthen the function of compensating for a difference in data processing speed. Alternatively, the primary and secondary storage sections 1121, 1122 may be disposed inside the core unit 1110 and tertiary storage sections 1123 may be disposed outside the core unit 1110.

The bus interface 1130 is a part which connects the core unit 1110, the cache memory 1120 and external device and allows data to be efficiently transmitted.

The processor 1100 in accordance with this embodiment may include a plurality of core units 1110, and the plurality of core units 1110 may share the cache memory 1120. The plurality of core units 1110 and the cache memory 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another embodiment, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 in accordance with this embodiment may further include an embedded memory 140 which stores data, a communication module 1150 which can transmit and receive data to and from an external device in a wired or wireless manner, a memory controller 1160 which drives an external memory device, and a media processor 1170 which processes the data processed in the processor 1100 or the data inputted from an external input device and outputs the processed data to an external interface device, and the like.

Besides, the processor 1100 may include a plurality of various modules and devices. The plurality of modules which are added may exchange data with the core units 1110 and the cache memory 1120 and with one another, through the bus interface 1130.

The embedded memory 1140 may include not only a volatile memory but also a nonvolatile memory. The volatile memory may include a DRAM (dynamic random access memory), a mobile DRAM, an SRAM (static random access memory), and a memory with similar functions to above mentioned memories, and the like. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and the like. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and the like.

The memory controller 1160 is to administrate and process data transmitted between the processor 1100 and an external storage device operating according to a different communication standard. The memory controller 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The media processor 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and the like.

Figure 8:
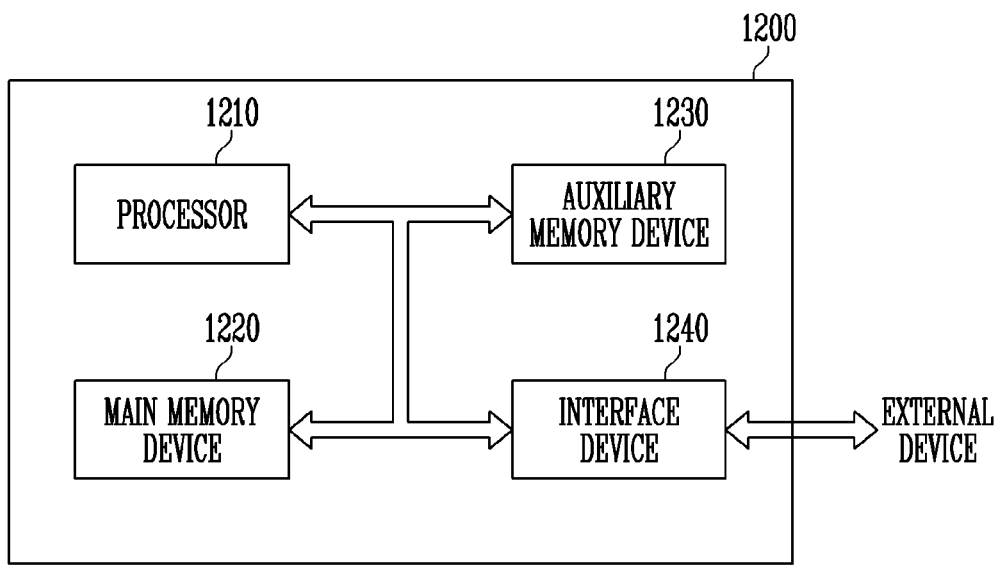
FIG. 8 is a configuration view of a system implementing a memory device in accordance with an embodiment of the present disclosure.

FIG. 8 is a configuration view of a system implementing a memory device in accordance with an embodiment of the present disclosure.

Referring to FIG. 8, the system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and the like. The system 1200 of this embodiment may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and the like.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and the like.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the embodiments. For example, the main memory device 1220 may include a semiconductor memory including: a first variable resistance layer including antimony (Sb); a second variable resistance layer including antimony (Sb) with a content different from that of the first variable resistance layer, the second variable resistance layer having a crystallization speed different from that of the first variable resistance layer; and a first electrode interposed between the first variable resistance layer and the second variable resistance layer. Consequently, operational characteristics of the system 1200 can be improved.

Also, the main memory device 1220 may further include a static random access memory (SRAM), a dynamic random access memory (DRAM), and the like, of a volatile memory type in which all contents are erased when power supply is cut off. Unlike this, the main memory device 1220 may not include the semiconductor devices in accordance with the embodiments, but may include a static random access memory (SRAM), a dynamic random access memory (DRAM), and the like, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the embodiments. For example, the auxiliary memory device 1230 may include a semiconductor memory including: a first variable resistance layer including antimony (Sb); a second variable resistance layer including antimony (Sb) with a content different from that of the first variable resistance layer, the second variable resistance layer having a crystallization speed different from that of the first variable resistance layer; and a first electrode interposed between the first variable resistance layer and the second variable resistance layer. Consequently, operational characteristics of the system 1200 can be improved.

Also, the auxiliary memory device 1230 may further include a data storage system (see 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like. Unlike this, the auxiliary memory device 1230 may not include the semiconductor devices in accordance with the embodiments, but may include data storage systems (see 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The interface device 1240 may be to perform exchange of commands and data between the system 1200 of this embodiment and an external device. The interface device 1240 may be a keypad, a keyboard, a mouse, a speaker, a mike, a display, various human interface devices (HIDs), a communication device, and the like. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and the like. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and the like.

Figure 9:
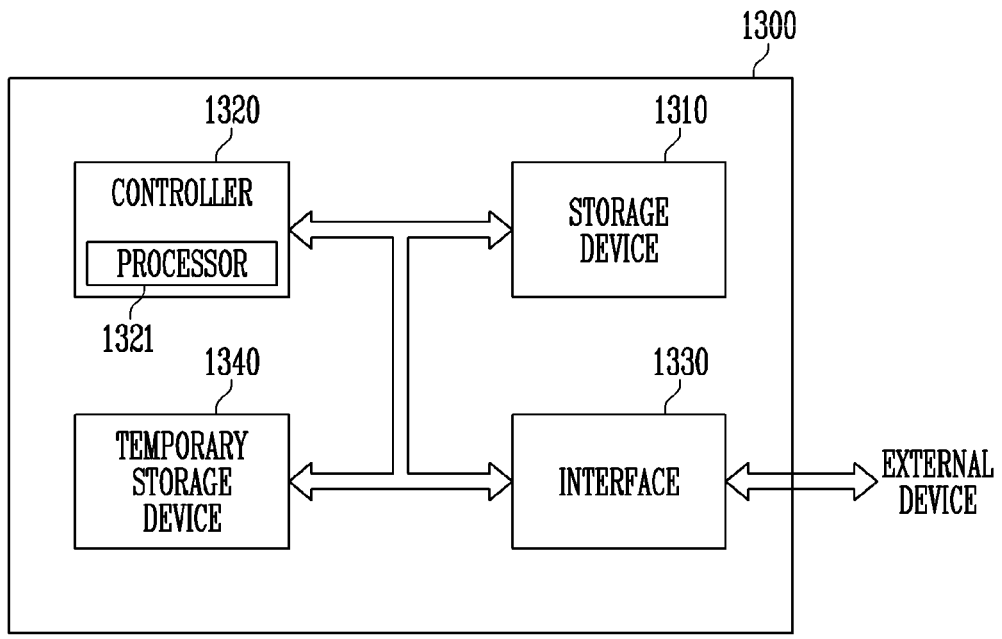
FIG. 9 is a configuration view of a data storage system implementing a memory device in accordance with an embodiment of the present disclosure.

FIG. 9 is a configuration view of a data storage system implementing a memory device in accordance with an embodiment of the present disclosure.

Referring to FIG. 9, the data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and the like, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and the like.

The controller 1320 may control exchange of data between the storage device 1310 and the interface 1330. To this end, the controller 1320 may include a processor 1321 for performing an operation for, processing commands inputted through the interface 1330 from an outside of the data storage system 1300, and the like.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and the like, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the embodiments. For example, the temporary storage device 1340 may include a semiconductor memory including: a first variable resistance layer including antimony (Sb); a second variable resistance layer including antimony (Sb) with a content different from that of the first variable resistance layer, the second variable resistance layer having a crystallization speed different from that of the first variable resistance layer; and a first electrode interposed between the first variable resistance layer and the second variable resistance layer. Accordingly, operational characteristics of the temporary storage device 1340 can be improved. Consequently, operational characteristics of the data storage system 1300 can be improved.

Figure 10:
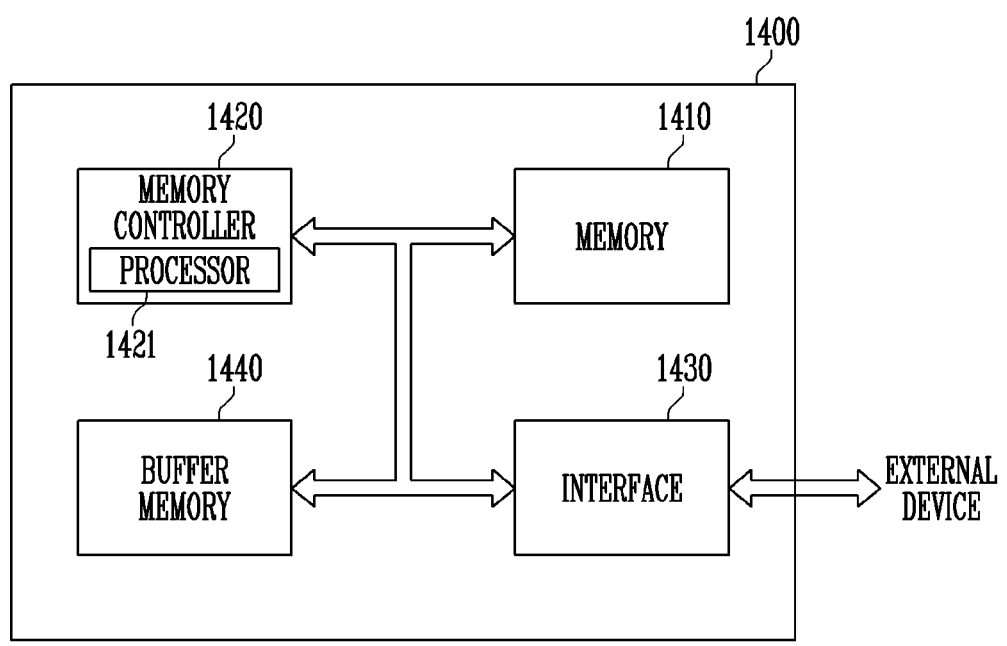
FIG. 10 is a configuration view of a memory system implementing a memory device in accordance with an embodiment of the present disclosure.

FIG. 10 is a configuration view of a memory system implementing a memory device in accordance with an embodiment of the present disclosure.

Referring to FIG. 10, the memory system 1400 may include a memory 1410 which has a nonvolatile characteristic as a component for storing data, a memory controller 1420 which controls the memory 1410, an interface 1430 for connection with an external device, and the like. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The memory 1410 for storing data may include one or more of the above-described semiconductor devices in accordance with the embodiments. For example, the memory 1410 may include a semiconductor memory including: a first variable resistance layer including antimony (Sb); a second variable resistance layer including antimony (Sb) with a content different from that of the first variable resistance layer, the second variable resistance layer having a crystallization speed different from that of the first variable resistance layer; and a first electrode interposed between the first variable resistance layer and the second variable resistance layer. Accordingly, operational characteristics of the memory 1410 can be improved. Consequently, operational characteristics of the memory system 1400 can be improved.

Also, the memory 1410 of this embodiment may further include a ROM (read only memory), a NOR flash memory, a NAND flash memory, a phase change random access memory (PRAM), a resistive random access memory (RRAM), a magnetic random access memory (MRAM), and the like, which have a nonvolatile characteristic.

The memory controller 1420 may control exchange of data between the memory 1410 and the interface 1430. To this end, the memory controller 1420 may include a processor 1421 for performing an operation for processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like, or be compatible with interfaces which are used in devices similar to the above mentioned devices. The interface 1430 may be compatible with one or more interfaces having a different type from each other.

The memory system 1400 of this embodiment may further include a buffer memory 1440 for efficiently transferring data between the interface 1430 and the memory 1410 according to diversification and high performance of an interface with an external device, a memory controller and a memory system. The buffer memory 1440 for temporarily storing data may include one or more of the above-described semiconductor devices in accordance with the embodiments. For example, the buffer memory 1440 may include a semiconductor memory including: a first variable resistance layer including antimony (Sb); a second variable resistance layer including antimony (Sb) with a content different from that of the first variable resistance layer, the second variable resistance layer having a crystallization speed different from that of the first variable resistance layer; and a first electrode interposed between the first variable resistance layer and the second variable resistance layer. Consequently, operational characteristics of the memory system 1400 can be improved.

Moreover, the buffer memory 1440 of this embodiment may further include an SRAM (static random access memory), a DRAM (dynamic random access memory), and the like, which have a volatile characteristic, and a phase change random access memory (PRAM), a resistive random access memory (RRAM), a spin transfer torque random access memory (STTRAM), a magnetic random access memory (MRAM), and the like, which have a nonvolatile characteristic. Unlike this, the buffer memory 1440 may not include the semiconductor devices in accordance with the embodiments, but may include an SRAM (static random access memory), a DRAM (dynamic random access memory), and the like, which have a volatile characteristic, and a phase change random access memory (PRAM), a resistive random access memory (RRAM), a spin transfer torque random access memory (STTRAM), a magnetic random access memory (MRAM), and the like, which have a nonvolatile characteristic.

In accordance with embodiments of the present disclosure, the operational characteristics and reliability of the electronic device can be improved. For example, a memory cell (e.g., the memory cell MC in FIG. 3) in accordance with an embodiment of the present disclosure includes a plurality of variable resistance layers (e.g., the plurality of variable resistance layers 31, 32, and 33 in FIG. 3) to store multi-bit data therein. The plurality of variable resistance layers of the memory cell according to an embodiment of the present disclosure have different crystallization speeds or set operation speeds from each other. As a result, a magnitude of a current or a voltage used for programming the memory cell MC according to an embodiment of the present disclosure may be reduced compared to that used for programming a conventional memory cell.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An electronic device comprising a semiconductor memory, wherein the semiconductor memory includes:
   a first variable resistance layer including antimony (Sb);
   a second variable resistance layer including antimony (Sb) with a content higher than that of the first variable resistance layer, the second variable resistance layer having a crystallization speed higher than that of the first variable resistance layer; and
   a first electrode interposed between the first variable resistance layer and the second variable resistance layer.

2. The electronic device of claim 1, wherein the first variable resistance layer includes germanium (Ge) of 10 to 20 at %, antimony (Sb) of 20 to 25 at %, and tellurium (Te) of 45 to 55 at %, and
   wherein the second variable resistance layer includes germanium (Ge) of 10 to 20 at %, antimony (Sb) of 25 to 30 at %, and tellurium (Te) of 45 to 55 at %.

3. The electronic device of claim 1, wherein one or both of the first and second variable resistance layers include a doping element of 0 to 25 at %, and the doping element includes one or more of B, C, N, O, Si, Zn, Ga, As, Se, Ag, In, and Sn.

4. The electronic device of claim 1, wherein the second variable resistance layer is selectively crystallized by applying a first partial set pulse.

5. The electronic device of claim 4, wherein the first and second variable resistance layers are crystallized by applying a second partial set pulse for a period longer than that of the first partial set pulse.

6. The electronic device of claim 5, wherein the first partial set pulse and the second partial set pulse have different waveforms.

7. The electronic device of claim 1, further comprising:
a third variable resistance layer including antimony (Sb) with a content different from those of the first and second variable resistance layers; and
a second electrode interposed between the second variable resistance layer and the third variable resistance layer.

8. The electronic device of claim 7, wherein the first, second, and third variable resistance layers have different crystallization speeds.

9. The electronic device of claim 7, wherein the first variable resistance layer includes germanium (Ge) of 10 to 20 at %, antimony (Sb) of 20 to 25 at %, and tellurium (Te) of 45 to 55 at %,
wherein the second variable resistance layer includes germanium (Ge) of 10 to 20 at %, antimony (Sb) of 25 to 30 at %, and tellurium (Te) of 45 to 55 at %, and
wherein the third variable resistance layer includes germanium (Ge) of 10 to 20 at %, antimony (Sb) of 30 to 35 at %, and tellurium (Te) of 45 to 55 at %.

10. The electronic device of claim 9, wherein the first variable resistance layer further includes one or more of C, N, O, Si, Ga, As, and Se, and the third variable resistance layer further includes one or more of B, Zn, Ag, In, and Sn.

11. An electronic device comprising a semiconductor memory, wherein the semiconductor memory includes:
a first variable resistance layer including antimony (Sb);
a second variable resistance layer including antimony (Sb) with a content higher than that of the first variable resistance layer, the second variable resistance layer having a crystallization speed higher than that of the first variable resistance layer;
a third variable resistance layer including antimony (Sb) with a content higher than that of the second variable resistance layer, the third variable resistance layer having a crystallization speed higher than that of the second variable resistance layer;
a first electrode interposed between the first variable resistance layer and the second variable resistance layer; and
a second electrode interposed between the second variable resistance layer and the third variable resistance layer.

12. The electronic device of claim 11, wherein one or more of the first, second, and third variable resistance layers further include a doping element of 0 to 25 at %.

13. The electronic device of claim 12, wherein the doping element includes one or more of B, C, N, O, Si, Zn, Ga, As, Se, Ag, In, and Sn.

14. The electronic device of claim 11, wherein the first variable resistance layer further includes one or more of C, N, O, Si, Ga, As, and Se, and the third variable resistance layer further includes one or more of B, Zn, Ag, In, and Sn.

15. The electronic device of claim 11, wherein the third variable resistance layer is selectively crystallized by applying a first partial set pulse, the second and third variable resistance layers are selectively crystallized by applying a second partial set pulse for a period longer than that of the first partial set pulse, and the first, second, and third variable resistance layers are crystallized by applying a fully set pulse for a period longer than each of those of the first partial set pulse and the second partial set pulse.

16. The electronic device of claim 11, wherein the first, second, and third variable resistance layers are reset by applying a reset pulse.

17. An electronic device comprising a semiconductor memory, wherein the semiconductor memory includes:
a first variable resistance layer;
a second variable resistance layer having a crystallization speed higher than that of the first variable resistance layer; and
a first electrode interposed between the first variable resistance layer and the second variable resistance layer,
wherein the second variable resistance layer includes antimony (Sb) with a content higher than that of the first variable resistance layer, and
wherein the first variable resistance layer, or the second variable resistance layer, or both include a first doping element which decreases a crystallization speed of a variable resistance material or a second doping element which increases the crystallization speed.

18. The electronic device of claim 17, wherein the first doping element of the first variable resistance layer includes one or more of C, N, O, Si, Ga, As, and Se.

19. The electronic device of claim 17, wherein the second doping element of the second variable resistance layer includes one or more of B, Zn, Ag, In, and Sn.

* * * * *